United States Patent
Im

(10) Patent No.: US 9,818,762 B2
(45) Date of Patent: Nov. 14, 2017

(54) ARRANGEMENT OF PASSIVATION LAYERS IN A PIXEL UNIT OF AN ARRAY SUBSTRATE AND DISPLAY DEVICE

(71) Applicant: BOE TECHNOLOGY GROUP CO., LTD., Beijing (CN)

(72) Inventor: Yunsik Im, Beijing (CN)

(73) Assignee: BOE TECHNOLOGY GROUP., LTD., Beijing (CN)

( * ) Notice: Subject to any disclaimer, the term of this patent is extended or adjusted under 35 U.S.C. 154(b) by 38 days.

(21) Appl. No.: 14/101,881

(22) Filed: Dec. 10, 2013

(65) Prior Publication Data

US 2014/0209935 A1    Jul. 31, 2014

(30) Foreign Application Priority Data

Jan. 28, 2013   (CN) .......................... 2013 1 0031290

(51) Int. Cl.
| | | |
|---|---|---|
| H01L 29/207 | (2006.01) | |
| H01L 33/00 | (2010.01) | |
| H01L 27/12 | (2006.01) | |
| G02F 1/1343 | (2006.01) | |
| G02F 1/1333 | (2006.01) | |
| G02F 1/1362 | (2006.01) | |

(52) U.S. Cl.
CPC ........ *H01L 27/1214* (2013.01); *G02F 1/1362* (2013.01); *G02F 1/133345* (2013.01); *G02F 1/134363* (2013.01); *H01L 27/1248* (2013.01); *H01L 27/1255* (2013.01)

(58) Field of Classification Search
CPC ............. H01L 27/1259; H01L 27/3262; H01L 27/1214; H01L 27/1248

USPC .......................................... 257/40, 59, 88, 93
See application file for complete search history.

(56) References Cited

U.S. PATENT DOCUMENTS

| | | | | |
|---|---|---|---|---|
| 5,182,620 A | * | 1/1993 | Shimada | ............ G02F 1/136213 257/72 |
| 5,657,101 A | * | 8/1997 | Cheng | ............... G02F 1/136213 257/59 |
| 5,670,792 A | * | 9/1997 | Utsugi | ................. G09G 3/3233 257/40 |

(Continued)

FOREIGN PATENT DOCUMENTS

| | | |
|---|---|---|
| CN | 102540596 A | 7/2012 |
| EP | 2472310 A1 | 7/2012 |
| JP | 2004-062145 A | 2/2004 |

OTHER PUBLICATIONS

Extended European Search Report for European Patent Application No. 14150532.1 dated May 6, 2014, 5pgs.

(Continued)

*Primary Examiner* — Lex Malsawma
*Assistant Examiner* — Eric W Jones
(74) *Attorney, Agent, or Firm* — Ladas & Parry LLP

(57) ABSTRACT

An array substrate and a display device are disclosed. The array substrate includes: a TFT, a pixel electrode layer driven by the TFT, a data line, a first passivation layer and a common electrode layer disposed on a substrate, the data line is for driving the TFT, the first passivation layer is disposed between the pixel electrode layer and the common electrode layer, the array substrate further includes a second passivation layer disposed between the common electrode layer and the data line and located in a region corresponding to the data line.

18 Claims, 1 Drawing Sheet

(56) References Cited

U.S. PATENT DOCUMENTS

| | | | |
|---|---|---|---|
| 6,252,290 B1* | 6/2001 | Quek et al. | 257/522 |
| 6,940,566 B1* | 9/2005 | Rho | G02F 1/136213 257/59 |
| 2002/0149729 A1 | 10/2002 | Nishimura et al. | |
| 2003/0071931 A1 | 4/2003 | Nakayoshi et al. | |
| 2005/0168142 A1* | 8/2005 | Murakami | G09G 3/3208 313/506 |
| 2006/0147650 A1* | 7/2006 | Park | H01L 27/1214 428/1.1 |
| 2006/0158597 A1 | 7/2006 | Ito et al. | |
| 2007/0273819 A1 | 11/2007 | Kawasaki et al. | |
| 2008/0002079 A1* | 1/2008 | Kimura | 349/42 |
| 2012/0068185 A1* | 3/2012 | Kim | H01L 27/3244 257/72 |
| 2012/0113080 A1 | 5/2012 | Den Boer | |
| 2012/0169985 A1 | 7/2012 | Kim et al. | |
| 2012/0280332 A1* | 11/2012 | You et al. | 257/408 |

OTHER PUBLICATIONS

English abstract of CN102540596A, 1 page.

First Office Action (Chinese language) issued by the State Intellectual Property Office ("SIPO") dated Oct. 31, 2014 for International Application No. 201310031290.1, 6 pages.

English translation of first Office Action issued by SIPO, dated Oct. 31, 2014 for International Application No. 201310031290.1, 4 pages.

Second Chinese Office Action dated Apr. 14, 2015; Appln. No. 201310031290.1.

\* cited by examiner

US 9,818,762 B2

ARRANGEMENT OF PASSIVATION LAYERS IN A PIXEL UNIT OF AN ARRAY SUBSTRATE AND DISPLAY DEVICE

CROSS REFERENCE TO RELATED APPLICATIONS

This application claims priority from Chinese National Application No. 201310031290.1 filed on Jan. 28, 2013, the contents of which are incorporated herein by reference.

FIELD OF THE ART

Embodiments of the invention relate to the field of display technologies, more particularly, to an array substrate and a display device.

BACKGROUND

A conventional Liquid Crystal Display (LCD) generally has a refresh rate of more than 60 Hz (that is, more than 60 frames are refreshed per second) so as to meet the display requirement of moving pictures. A higher refresh rate means that the drive circuit has to provide a drive signal of a higher frequency for the pixel unit of the LCD panel. To maintain a valid high frequency driving, a higher drive voltage is needed in the circuit. However, using a drive signal of both high frequency and high voltage for a long term will not only damage the devices but also consume much power, which is not conducive to energy saving and environmental protection.

For the purpose of realizing low-voltage drive, a technology in which the drive frequency is adjusted depending on the picture to be displayed is proposed in conventional technologies. For example, when display moving pictures, a normal frequency higher than 60 Hz is used for driving; while the drive frequency is accordingly decreased when display stationary pictures. The above driving solution may be realized by modifying the drive circuit. However, in real applications, the low frequency and low voltage will make the Voltage Holding Ratio (VHR) of the pixel unit (which is amplitude decreasing ratio of the time-variant voltage after the pixel unit is charged) low, thereby deteriorating the screen flicker.

A general formula for calculating VHR is as follows:

$$VHR = 100\% \times \left(1 - \frac{I_{leak} \times t_{frame}}{C_{st} + C_{LC}}\right)$$

where $I_{leak}$ is the leakage current of the circuit, $t_{frame}$ is time for displaying a frame, $C_{st}$ is storage capacitance of the pixel electrode, $C_{LC}$ is the liquid crystal capacitance. When the refresh rate is changed, $t_{frame}$ is the first to change. For example, under a refresh rate of 60 Hz, $t_{frame}$ is 16.7 ms. When the refresh rate is reduced to 30 Hz, $t_{frame}$ will be 33.4 ms. It is thus seen that $(C_{st}+C_{LC})$ has to be adjusted dynamically in order to maintain VHR.

As illustrated in FIG. 1, a configuration which dynamically adjusts the storage capacitance $C_{st}$ is employed in the conventional arts. A TFT 101 is the driving TFT; a parasitic capacitor $C_{st}1$ is formed between the common electrode line 103 and the pixel electrode 105. When displaying a stationary picture, the drive frequency of the LCD is decreased, and a dedicated TFT 102 in a regular pixel is driven, that is, the TFT 102 is turned on. As a result, the electrode 104 is connected to the common electrode line 103, thereby increasing the area of the pixel electrode for generating the parasitic capacitor, and the parasitic capacitor $C_{st}2$ is formed between the electrode 104 and the pixel electrode 105, which in turn increases the parasitic capacitor $C_{st}=C_{st}1+C_{st}2$ and maintains VHR at a high level. However, in the above application of the conventional art, the TFT 102 for controlling the variable $C_{st}$ has to be introduced in the circuit and signal lines dedicated for the TFT 102 have to be provided, in order to achieve the adjustment of the magnitude of the parasitic capacitor depending on the frequency. Introducing those elements in the pixel region will definitely affect the transmissivity of the backlight, thereby reducing the aperture ratio of the panel and impacting the display quality.

SUMMARY

An array substrate and a display device are provided with an objective of solving the problem of the aperture ratio being reduced due to the dynamically variable $C_{st}$.

An aspect of the invention provides an array substrate, comprising: at least a TFT, a pixel electrode layer driven by the TFT, a data line, a first passivation layer and a common electrode layer, all of which are disposed on a substrate, the data line is for driving the TFT, the first passivation layer is disposed between the pixel electrode layer and the common electrode layer, wherein the array substrate further comprises a second passivation layer disposed between the common electrode layer and the data line and located in a region corresponding to the data line.

As an example, the first passivation layer is disposed on the TFT, the pixel electrode layer and the data line; the second passivation layer is disposed on the first passivation layer and located in a region above the data line; the common electrode layer is disposed on the first passivation layer and the second passivation layer.

As an example, the common electrode layer directly overlays the substrate; the first passivation layer is disposed on the common electrode layer; the TFT, the pixel electrode layer and the data line are disposed on the first passivation layer; the second passivation layer is disposed on the first passivation layer and located in a region below the data line.

As an example, a thickness of the first passivation layer is less than 6500 Å.

As an example, a thickness of the second passivation layer is 1500 Å~5000 Å.

As an example, the second passivation layer is made of resin or silicon nitrides.

Another aspect of the invention provides a display device comprising the above array substrate.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

According to the invention, considering that VHR is most influenced by the parasitic capacitance, the parasitic capacitance is maximized within the reasonable range such that VHR may be maintained as high as possible without affecting the aperture ratio and introducing additional TFTs and corresponding signal lines in the substrate.

Figure 1:
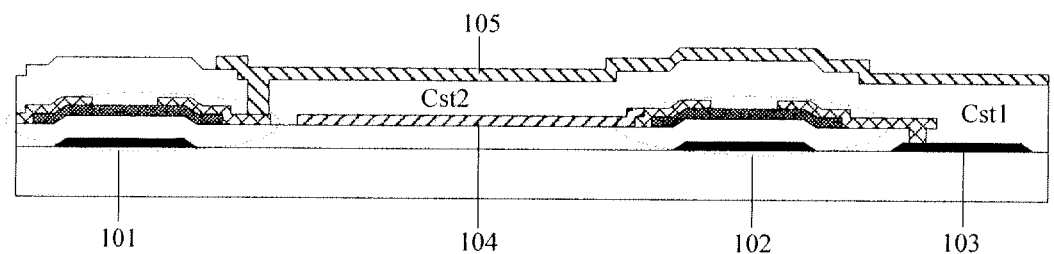
FIG. 1 illustrates a cross section of a conventional array substrate.
Figure 2:
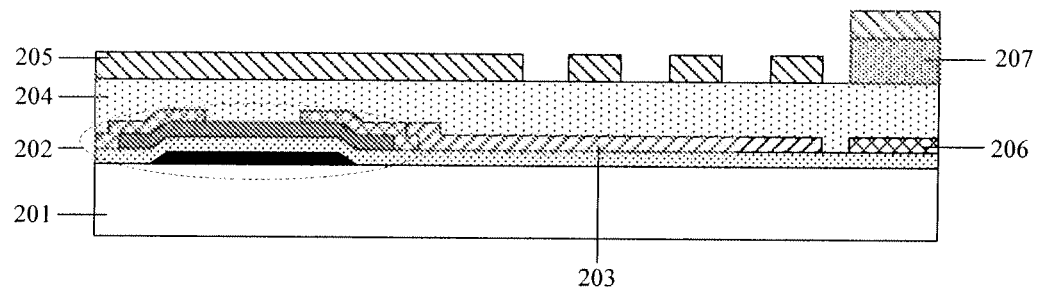
FIG. 2 illustrates a cross section of an array substrate in accordance with an embodiment of the invention.

As illustrated in FIG. 2, an embodiment of the invention is described with reference to an example of an ADvanced Super Dimension Switch (ADS) mode array substrate (a FFS mode array substrate may be also used herein). The array substrate comprises: a TFT 202 (bottom-gate) disposed on a substrate 201, a pixel electrode layer 203 driven by the TFT 202, a gate line (not shown in the figure), a data line 206 (formed at the same time as source/drain of the TFT), a first passivation layer 204, a second passivation layer 207 and a common electrode layer 205. In the embodiment, the common electrode layer 205 comprises strip common electrodes and disposed over the pixel electrode 203. The gate line is used for switch on/off the driving of the TFT 202; a signal on the data line 206 is transmitted to the pixel electrode layer 203 via the TFT 202; the first passivation layer 204 is disposed on the TFT 202 and the pixel electrode layer 203. The second passivation layer 207 is disposed between the common electrode layer 205 and the data line 206, that is, located on the first passivation layer 204 and in a corresponding region above the data line 206.

The substrate 201 is for example a glass substrate. The pixel electrode layer 203 and the common electrode layer 205 are for example transparent oxide film, such as ITO (Indium tin oxide), IZO (Indium zinc oxide) and the like. A pattern and position of the pixel electrode layer 203 and the common electrode layer 205 are disposed according to the conventional ADS mode, that is, the common electrode is disposed above the data line 206 and shields the electric field between the data line 206 and the pixel electrode, thereby improving the aperture ratio. The TFT comprises gate (G), source (S) and drain (D), source (S) of the TFT is electrically connected to the pixel electrode, gate S of the TFT is electrically connected to the gate line.

For the purpose of achieving a large storage capacitance, in the array substrate as illustrated in FIG. 2 a thickness of the first passivation layer 204 may be configured according to the needed storage capacitance. That is, the thickness of the first passivation layer 204 between the pixel electrode layer 203 and the common electrode layer 205 may be decreased from the present 6500 Å according to the desired frequency, thereby increasing the storage capacitance between the pixel electrode and the common electrode. However, when the thickness of the first passivation layer 204 is reduced, a distance between the data line 206 and the common electrode layer 205 is decreased, thereby forming a large parasitic capacitor between the data line 206 and the common electrode layer 205, which would influence the normal function of the data line 206. In this case, the second passivation layer 207 is disposed between the data line 206 and the common electrode layer 205 so as to decrease the parasitic capacitor between the data line 206 and the common electrode layer 205. The second passivation layer 207 is used to further separate the data line 206 and the common electrode layer 205 by a distance such that influence from the capacitor in-between is minimized. The storage capacitance formed between the pixel electrode and the common electrode can be controlled through the thickness of the first passivation layer 204, and the parasitic capacitance between the common electrode and the data line can be controlled through the thickness of the second passivation layer 207. Moreover, the thicknesses of the first and second passivation layers 204 and 207 can be controlled separately. Designers may customize the design according to performance of specific products. The second passivation layer 207 is for example made of resin or silicon nitrides (SiNx), with a thickness of for example 1500 Å~5000 Å. The first passivation layer 204 may be of the same material as the second passivation layer 207 and with a thickness of for example less than 6500 Å.

Figure 3:
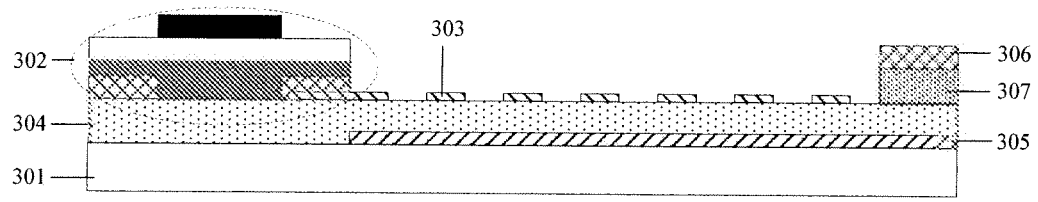
FIG. 3 illustrates a cross section of an array substrate in accordance with another embodiment of the invention.

Another typical ADS array substrate as illustrated in FIG. 3 is provided according to another embodiment of the invention. The array substrate comprises a substrate 301, a common electrode layer 305 directly overlaying the substrate 301, a first passivation layer 304 disposed on the common electrode layer 305, the TFT 302 (top gate) disposed on the first passivation layer 304 and a pixel electrode layer 303. The second passivation layer 307 is disposed between the common electrode layer 305 and the data line 306, that is, located on the first passivation layer 304 and in a corresponding region below the data line 306.

In the embodiment, the second passivation layer 307 is disposed between the data line 306 and the common electrode layer 305, which are further separated by the second passivation layer 307 by a distance. In this way, the storage capacitance formed between the pixel electrode and the common electrode can be controlled through the thickness of the first passivation layer 304, and the parasitic capacitance between the common electrode and the data line can be controlled through the thickness of the second passivation layer 307. Moreover, the thicknesses of the first and second passivation layers 304 and 307 can be controlled separately.

It is noted that the above embodiments are described in related to a pixel unit of the array substrate, it is well-known in the art that the array substrate consists of a plurality of pixel units, each of which comprises a same TFT as above mentioned.

Still another embodiment of the invention provides a display device comprising the above array substrate. The display device may be a LC panel, an E-paper, an OLED panel, a plasma panel, a LC television, a LCD, a digital photo-frame, a mobile phone, a tablet PC and any product or component having a display function.

In the above embodiments of the invention, the parasitic capacitance of the pixel electrode is increased by adjusting the thickness of the first passivation layer between the pixel electrode layer and the common electrode layer, thereby maintaining VHR of the pixel electrode above a certain level. As a result, screen flicker will not be induced by too low VHR when dynamically decreasing the drive frequency of the LCD. As no elements and its corresponding lines for controlling the parasitic capacitance is needed, the aperture ratio is not affected, thereby guaranteeing the display quality. Moreover, the data line and the common electrode is further separated by a distance by using the second passivation layer, and the capacitance therebetween is minimized, thereby ensuing normal function of the data line.

What are described above is related to the illustrative embodiments of the disclosure only and not limitative to the scope of the disclosure; the scopes of the disclosure are defined by the accompanying claims.

What is claimed is:

1. An array substrate, comprising: a TFT, a pixel electrode layer driven by the TFT, a data line, a first passivation layer and a common electrode layer disposed on a substrate,
   wherein the data line is for driving the TFT, the first passivation layer is sandwiched between the pixel electrode layer and the common electrode layer, and the pixel electrode layer and the common electrode layer are configured to form a storage capacitor;
   wherein the array substrate further comprises a second passivation layer disposed between the common electrode layer and the data line in a vertical direction normal to the array substrate and located in a region corresponding to the data line in the vertical direction; and
   wherein the first passivation layer and the second passivation layer are sandwiched between the data line and the common electrode layer, and the pixel electrode layer is closer to the common electrode layer than the data line.

2. The array substrate of claim 1, wherein the first passivation layer is disposed on the TFT, the pixel electrode layer and the data line; the second passivation layer is disposed on the first passivation layer and located in a region above the data line; the common electrode layer is disposed on the first passivation layer and the second passivation layer.

3. The array substrate of claim 2, wherein the second passivation layer is made of resin or silicon nitrides.

4. The array substrate of claim 1, wherein the common electrode layer directly overlays the substrate; the first passivation layer is disposed on the common electrode layer; the TFT, the pixel electrode layer and the data line are disposed on the first passivation layer; the second passivation layer is disposed on the first passivation layer and located in a region below the data line.

5. The array substrate of claim 4, wherein the second passivation layer is made of resin or silicon nitrides.

6. The array substrate of claim 1, wherein a thickness of the first passivation layer is less than 6500 Å.

7. The array substrate of claim 6, wherein the second passivation layer is made of resin or silicon nitrides.

8. The array substrate of claim 1, wherein a thickness of the second passivation layer is 1500 Å~5000 Å.

9. The array substrate of claim 8, wherein the second passivation layer is made of resin or silicon nitrides.

10. The array substrate of claim 1, wherein the second passivation layer is made of resin or silicon nitrides.

11. A display device comprising the array substrate of claim 1.

12. The array substrate of claim 1, wherein the second passivation layer is located only in the region corresponding to the data line in the vertical direction.

13. The array substrate of claim 1, wherein the first passivation layer is disposed between the common electrode layer and the data line in the vertical direction, and the common electrode layer overlaps the data line in the vertical direction.

14. The array substrate of claim 1, wherein a thickness of the first passivation layer is configured to increase a storage capacitance between the pixel electrode and the common electrode, and a thickness of the second passivation layer is configured to decrease a parasitic capacitor between the data line and the common electrode layer.

15. The array substrate of claim 1, wherein a vertical distance between the pixel electrode layer and the common electrode layer is smaller than a vertical distance between the data line and the common electrode layer.

16. The array substrate of claim 1, wherein a capacitance value of the storage capacitor formed between the pixel electrode layer and the common electrode layer is controlled at least by a thickness of the first passivation layer.

17. The array substrate of claim 1, wherein the common electrode layer and the data line form a parasitic capacitor, and a capacitance value of the parasitic capacitor is controlled at least by a thickness of the second passivation layer.

18. The array substrate of claim 1, wherein both the pixel electrode layer and the data line are located directly above the common electrode layer.

* * * * *